United States Patent
Mizusawa

(10) Patent No.: US 8,766,513 B2
(45) Date of Patent: Jul. 1, 2014

(54) PIEZOELECTRIC DEVICE

(75) Inventor: Shuichi Mizusawa, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 111 days.

(21) Appl. No.: 13/246,141

(22) Filed: Sep. 27, 2011

(65) Prior Publication Data

US 2012/0074816 A1 Mar. 29, 2012

(30) Foreign Application Priority Data

Sep. 28, 2010 (JP) ................................. 2010-217058

(51) Int. Cl.
*H01L 41/047* (2006.01)

(52) U.S. Cl.
USPC ............ 310/366; 310/367; 310/344; 310/348

(58) Field of Classification Search
USPC ......... 310/344, 348, 340, 360, 365, 366, 370, 310/320, 321
IPC .................................. H03H 9/02; H01L 41/047
See application file for complete search history.

(56) References Cited

U.S. PATENT DOCUMENTS

| | | | |
|---|---|---|---|
| 2001/0017505 A1 | 8/2001 | Aratake et al. | |
| 2010/0207697 A1* | 8/2010 | Sayama | 310/348 |
| 2011/0215678 A1* | 9/2011 | Kohda et al. | 310/344 |
| 2012/0133248 A1* | 5/2012 | Kusano | 310/348 |
| 2012/0242193 A1* | 9/2012 | Shimao et al. | 310/348 |

FOREIGN PATENT DOCUMENTS

| | | | | |
|---|---|---|---|---|
| JP | S56-000120 U | 1/1981 | | |
| JP | H08-316732 | 11/1996 | | |
| JP | H09-246867 | 9/1997 | | |
| JP | 2002-118437 | 4/2002 | | |
| JP | 2002-124845 | 4/2002 | | |
| JP | 2004-104117 | 4/2004 | | |
| JP | 2005-175686 A | 6/2005 | | |
| JP | 2007-060593 | 3/2007 | | |
| JP | 2007-173974 | 7/2007 | | |
| JP | 2008-166994 | 7/2008 | | |
| JP | WO2010074127 | * 7/2010 | | H03H 9/02 |

* cited by examiner

*Primary Examiner* — Thomas Dougherty
*Assistant Examiner* — Karen B Addison
(74) *Attorney, Agent, or Firm* — Alix, Yale & Ristas, LLP

(57) ABSTRACT

The piezoelectric device (100) stores a piezoelectric vibrating piece (10) which vibrates whenever an electrical voltage is applied. The piezoelectric device comprises: a package lid (11) having a first peripheral surface (M1) which surrounds a plane surface in a predetermined width; and a package base (12) comprising a second peripheral surface (M2) bonded to the first peripheral surface of the package lid and a recess portion recessed from the second peripheral surface. The first peripheral surface of the package lid and the second peripheral surface of the package base are rough surfaces, respective metal films (AC1, AC2) are formed on each rough surface, and the package lid and the package base are bonded using a sealing material (LG) formed between the metal films.

3 Claims, 14 Drawing Sheets

PIEZOELECTRIC DEVICE

CROSS-REFERENCE TO RELATED APPLICATION

This application claims priority to and the benefit of Japan Patent Application No. 2010-217058, filed on Sep. 28, 2010 in the Japan Patent Office, the disclosure of which is incorporated herein by reference in its entirety.

FIELD

This disclosure pertains to surface-mount type piezoelectric devices having strong adhesion between package bases and package lids.

DESCRIPTION OF THE RELATED ART

Generally, the surface-mount piezoelectric device comprises a package base for fixing the quartz-crystal vibrating piece and a package lid for covering the quartz-crystal vibrating piece. For example, Japan Unexamined Patent Document No. 2005-175686 discloses a piezoelectric device in which a ceramic base and a glass lid are fixed using a sealing material of, for example, low-melting-point glass. The piezoelectric device disclosed in Japan Unexamined Patent Document No. 2005-175686 may not provide sufficient bonding strength between the base and lid. If the sealing surface of the lid is mirror-polished, the interface between the sealing material and the lid fractures relatively easily. The bond between the sealing material and the sealing surface of the lid is improved if the bonding region (sealing surface) formed on the edge of the lid is made in a rough surface. The rough front surface made of glass is bonded to the ceramic base using the low-melting-point glass, to increase the bonding strength.

However, as the piezoelectric devices miniaturize, the surface area of the bonding region for applying the sealing material of, for example, low-melting-point glass, decreases in size, and a method for bonding the package lid and the package base with stronger bonding strength became necessary.

The present invention provides a piezoelectric device having strong bonding strength between the package base and the package lid.

SUMMARY

A first aspect is directed to a piezoelectric device. In its first aspect, the piezoelectric device stores a piezoelectric vibrating piece which vibrates whenever an electrical voltage is applied. The piezoelectric device comprises: a package lid having a first peripheral surface formed circumferentially on plane in a predetermined width; and; and a package base comprising a second peripheral surface bonded to the first peripheral surface of the package lid and a recess portion recessed from the second peripheral surface. The first peripheral surface of the package lid and the second peripheral surface of the package base are rough surfaces, respective metal films are formed on each rough surface, and the package lid and the package base are bonded using a sealing material formed between the metal films.

A second aspect is directed to a piezoelectric device. In its second aspect, the piezoelectric vibrating piece is made of a piezoelectric material; and the rough surfaces of the peripheral surfaces are formed rougher than a first surface of the piezoelectric material.

A third aspect is directed to a piezoelectric device. In its third aspect, the second peripheral surface of the package base is formed wider than the predetermined width; the piezoelectric vibrating piece is mounted onto the second peripheral surface of the package base using an electrically conductive adhesive; and the metal film is formed only on a bonding region of the peripheral surface where the first peripheral surface of the package lid and the second peripheral surface of the package base bond together.

A fourth aspect is directed to a piezoelectric device. In its fourth aspect, the rough surface is only formed on the bonding region of the second peripheral surface of the package base.

A sixth aspect is directed to a piezoelectric device. In its sixth aspect, the first peripheral surface of the package lid and the second peripheral surface of the package base have same width; and the piezoelectric vibrating piece is mounted inside and onto the recess defined by the base and/or lid using the electrically conductive adhesive.

A seventh aspect is directed to a piezoelectric device. In its seventh aspect, a pair of through-holes is formed which extends depthwise through the package base.

An eighth aspect is directed to a piezoelectric device. In its eighth aspect, a piezoelectric device comprises: a piezoelectric frame having a piezoelectric vibrating piece that vibrates when electrically energized and an outer frame including a first principal surface and a second principal surface formed as to surround the piezoelectric vibrating piece; a package lid having a first peripheral surface that is bonded to the first principal surface of the outer frame of the piezoelectric frame; and a package base having a second peripheral surface that is bonded to the second principal surface of the outer frame of the piezoelectric frame. The first principal surface and the second principal surface of the outer frame, the first peripheral surface of the package lid and the second peripheral surface of the package base have rough surfaces; respective metal films are formed on each rough surface; and the package lid and the outer frame, and the outer frame and the package base are bonded using a sealing material formed between the metal films.

A ninth aspect is directed to a piezoelectric device. In its ninth aspect, a pair of first castellations is formed on the peripheral edge of the outer frame of the piezoelectric frame, and a pair of second castellations is formed on the peripheral edge of the package base in a position corresponding to the respective first castellations when the piezoelectric frame and the package base are bonded together. The piezoelectric frame comprises: a pair of excitation electrodes formed on the first principal surface and the second principal surface of the piezoelectric vibrating piece; a first extraction electrode on the first principal surface extending from the excitation electrode on the first principal surface to the first castellation; a second extraction electrode on the second principal surface extending from the excitation electrode on the second principal surface to the first castellation; and a first side surface electrode that is electrically connected to the first extraction electrode and formed on the first castellation. The package base comprises a pair of second side surface electrodes that is electrically connected to the first side surface electrode or the second extraction electrode and formed on the pair of second castellations. The pair of connecting electrodes is formed on the first castellations and the second castellations, which electrically connects the first side surface electrode or the first extraction electrode to the second side surface electrode.

A tenth aspect is directed to a piezoelectric device. In its tenth aspect, the sealing material includes a glass that melts at temperature between 350° C. and 410° C. or a polyimide resin.

An eleventh aspect is directed to a piezoelectric device. In its eleventh aspect, the package lid and the package base is made of a glass or a piezoelectric material.

A twelfth aspect is directed to a method for manufacturing a piezoelectric device. In its twelfth aspect, a method for manufacturing a piezoelectric device comprises the steps of: a first preparation step of preparing a piezoelectric vibrating piece that vibrates when electrically energized; a second preparation step of preparing a lid wafer, including a plurality of package lids each having a first peripheral surface formed circumferentially on plane in a predetermined width; a first metal film forming step for forming a metal film on a rough surface on the lid wafer; a third preparation step of preparing a base wafer, including a plurality of package bases each having a second peripheral surface and a recess portion recessed from the second peripheral surface; a second metal film forming step for forming a metal film on a rough surface on the base wafer; a mounting step for mounting the piezoelectric vibrating piece onto the package base using an electrically conductive adhesive; and a bonding step for bonding the lid wafer and the base wafer using a sealing material between the respective metal films on said first and second peripheral surfaces.

A thirteenth aspect is directed to a method for manufacturing a piezoelectric device. In its thirteenth aspect, the respective rough surfaces on the lid wafer and the base wafer are formed by sand-blasting or etching.

According to present disclosure, a piezoelectric device having strong bonding strength between the package lid and the package base is provided.

DETAILED DESCRIPTION

Various embodiments are described in detail below, with reference to the accompanying drawings. In the described embodiments, an AT-cut quartz-crystal vibrating piece is used as an exemplary piezoelectric vibrating piece. An AT-cut quartz-crystal vibrating piece has a principal surface (in the YZ plane) that is tilted by 35° 15' about the Y-axis of the crystal coordinate system (XYZ) in the direction of the Y-axis from the Z-axis around the X-axis. Thus, in the following description, new axes tilted with respect to the axial directions of the quartz-crystal vibrating piece are denoted as the Y'-axis and Z'-axis, respectively. Therefore, the longitudinal direction of the quartz-crystal vibrating device is referred as the X-axis direction, the height direction is referred as the Y'-axis direction, and the direction normal to the X-axis and Y'-axis directions is referred as the Z'-axis direction, respectively.

First Embodiment

Overall Configuration of the First Quartz-Crystal Vibrating Device 100

Figure 1:
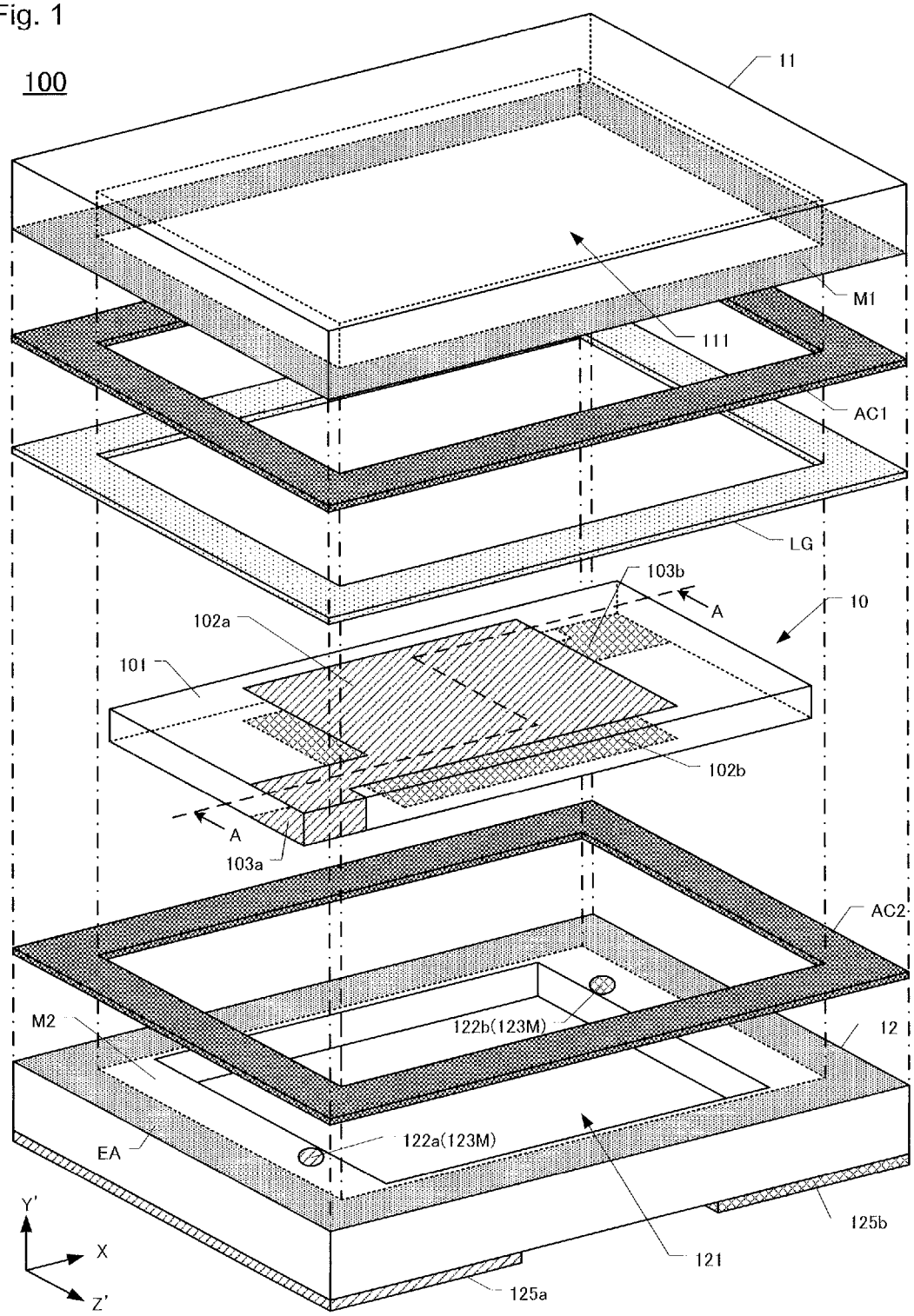
FIG. 1 is an exploded perspective view of the first quartz-crystal vibrating device 100.

The general configuration of a first quartz-crystal vibrating device 100 is described below with reference to FIGS. 1 and 2. FIG. 1 is an exploded perspective view of the first quartz-crystal vibrating device 100 and FIG. 2 is a cross-sectional view taken along A-A line of FIG. 1.

Figure 2:
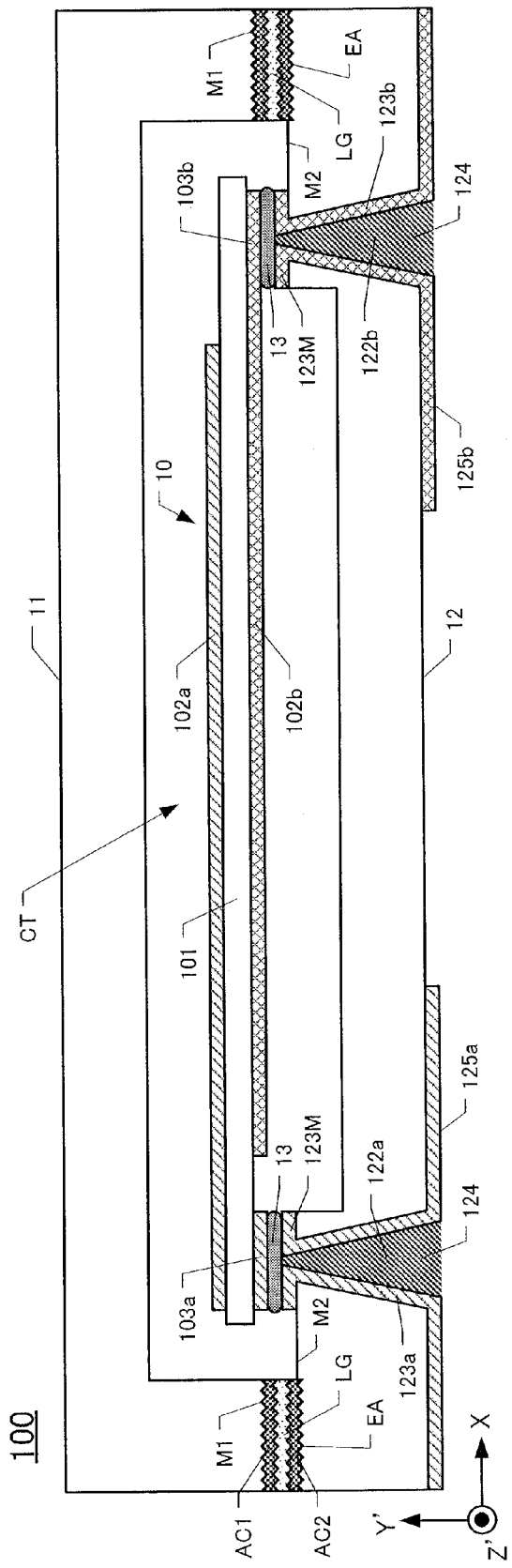
FIG. 2 is a cross-sectional view of FIG. 1 taken along A-A line.

As shown in FIGS. 1 and 2, the first quartz-crystal vibrating device 100 comprises a rectangular package lid 11 defining a lid recess 111 configured as a concavity in the inner main surface of the package lid 11, a package base 12 defining a base recess 121 in the inner main surface of the package base 12, and a rectangular quartz-crystal vibrating piece 10 mounted on the package base 12.

The quartz-crystal vibrating piece 10 comprises an AT-cut quartz-crystal piece 101. A pair of excitation electrodes 102a and 102b is disposed substantially centrally on each of the first and second principal surfaces of the quartz-crystal piece 101, facing each other across the thickness dimension of the quartz-crystal piece 101. An excitation electrode 102a is connected to the extraction electrode 103a and extends toward the +Z'-axis corner of bottom surface of the quartz-crystal piece 101 on the −X'-axis side. Similarly, a respective excitation electrode 102b is connected to the extraction electrode 103b and extends toward the −Z'-axis corner of bottom surface of the quartz-crystal piece 101 on the +X'-axis side. The quartz-crystal vibrating piece 10 is bonded to the package base 12 using electrically conductive adhesive 13, which is explained hereafter.

The first quartz-crystal vibrating device 100 comprises a package lid 11, which is fabricated from a quartz-crystal material or glass, having a lid recess 111 and a first peripheral surface M1 surrounding the lid recess 111. The first peripheral surface M1 is a rough surface having surface roughness Ra of 10 μm to 40 μm. Also, on the first peripheral surface M1, a metal film AC1 is formed, having a foundation layer of chromium (Cr) and overlaying gold (Au) layer. For the metal film AC1, an exemplary thickness of the chromium layer is approximately 500 Å, and an exemplary thickness of the gold layer is in the range of 1,500 Å to 2,500 Å. Here, since the first peripheral surface M1 for forming the metal film AC1 is rough surface, the metal film AC1 has strong bonding strength to the peripheral surface M1.

The first quartz-crystal vibrating device 100 further comprises a package base 12, which is fabricated from a quartz-crystal material or glass, having a base recess 121 and a second peripheral surface M2 surrounding the base recess 121. The cavity CT for storing the quartz-crystal vibrating piece 10 is defined in part as a concavity in the inner main surface of the lid recess 111 of the package lid 11 and in part by the base recess 121 of the package base 12. The cavity CT is filled with an inert-gas or is under a vacuum.

The second peripheral surface M2 has larger width than the first peripheral surface M1. The second peripheral surface M2 comprises a bonding region EA for bonding to the first peripheral surface M1 of the package lid 11. The bonding region EA is a rough surface having roughness Ra of 10 μm to 40 μm.

Also, on a bonding region EA on the second peripheral surface M2, a metal film AC2 is formed, having a foundation layer of chromium (Cr) and overlaying gold (Au) layer. For the metal film AC2, an exemplary thickness of the chromium layer is approximately 500 Å, and an exemplary thickness of the gold layer is in the range of 1,500 Å to 2,500 Å. Here, since the bonding region EA on the second peripheral surface M2 for forming the metal film AC2 is rough surface, the metal film AC2 has strong bonding strength to the bonding region EA of the second peripheral surface M2.

A through-hole 122a is formed with respect to −X-axis side and +Z'-axis direction, so as not to overlap the bonding region EA on the second peripheral surface M2. The through-hole 122a extends through the package base 12. Similarly, a through-hole 122b is formed with respect to +X-axis side and −Z'-axis direction, which extends through the package base 12. A pair of through-hole electrodes 123a and 123b are formed on the through-holes 122a and 122b, which includes a connecting pad 123M extending from the mounting surface (mounting surface of a quartz-crystal vibrating device) to the second peripheral surface M2. Further, a pair of external electrodes 125a and 125b are formed on the mounting surface of the package base 12 at both ends in the X-axis direction, each of which external electrodes 125a, 125b is electrically connected to respective through-hole electrodes 123a and 123b.

As shown in FIG. 2, the through-holes 122a and 122b are conically-shaped, spreading toward −Y'-axis side. The shapes are arranged so that, after bonding the package lid 11 and the package base 12, the through-holes can be easily filled with a sphere-shaped portion of eutectic alloy 124. As a eutectic alloy 124, a gold tin (Au—Sn) alloy, gold germanium (Au—Ge) or gold silicon (Au—Si) alloy, or a gold paste or silver paste is used.

On the quartz-crystal vibrating piece 10 in FIG. 2, an extraction electrode 103a is electrically connected to the through-hole electrode 123a and an extraction electrode 103b is electrically connected to the through-hole electrode 123b (123M), to the second peripheral surface M2 of the package base 12 using the electrically conductive adhesive 13.

Thus, the excitation electrodes 102a and 102b on the quartz-crystal vibrating piece 10 are electrically connected to the respective external electrodes 125a and 125b via the respective extraction electrodes 103a and 103b, the electrically conductive adhesive 13 and the respective through-hole electrodes 123a and 123b. Whenever an alternating voltage (voltage that alternates between positive and negative values) is applied across the pair of external electrodes 125a and 125b, the external electrode 125a, through-hole electrode 123a, extraction electrode 103a and excitation electrode 102a form a same polarity. Similarly, the external electrode 125b, through-hole electrode 123b, extraction electrode 103b and excitation electrode 102b form a same polarity.

The package lid 11 and the package base 12 are bonded using low-melting-point glass LG, which is a sealing material for sealing the metal films AC1 and AC2. Low-melting-point glass LG is a lead-free vanadium-based glass having an adhesive component that melts at 350° C. to 410° C. Vanadium-based glass can be formulated as a paste mixed with binder and solvent. Vanadium-based glass bonds to various materials by melting and solidification. The melting point of a vanadium-based glass is lower than the melting point of the package lid 11 or the melting point of the package base 12, and low-melting-point glass forms a highly reliable air-tight seal and resists water and humidity. Vanadium-based glass resists incursion of atmospheric water vapor into the cavity CT and thus prevents moisture-caused damage to the airtightness of the cavity CT. Also, since the coefficient of thermal expansion of low-melting-point glass can be controlled effectively by controlling its glass structure, the low-melting-point glass can be adjusted to various coefficients of thermal expansion.

In the first quartz-crystal vibrating device 100, adhesion strength between the respective surfaces can be strengthened by forming the metal film AC1 on the rough surface of the package lid 11, and forming the metal film AC2 on the rough surface of the package base 12. Therefore, even if one of the package lid 11 or the package lid 12 is fabricated from a glass and the other is fabricated from a quartz-crystal material and thus forms difference in the thermal coefficient, the package lid 11 and package base 12 are ensured to be bonded. Also, the presence of gold (Au) layer in the metal film AC1 and AC2, which has large thermal coefficient and is relatively soft, absorbs the difference in the thermal coefficients between components, and prevents the first quartz-crystal vibrating device 100 from being damaged even if used in environments with large temperature changes. Further, such formation minimizes the leakage of gas from outside of the first quartz-crystal vibrating device 100 into the cavity CT or vice versa.

<Bonding Strength of the Quartz-Crystal Vibrating Device>

In experiments regarding the bonding strength between components of the quartz-crystal vibrating device, it is difficult to determine the stress level at which the package lid and package base separate from each other. Thus, a measurement is taken to determine the amount of bending that can be tolerated the quartz-crystal vibrating device bonded onto a substrate, before the package lid and package base are separated from each other. Therefore, the quartz-crystal vibrating device bonded onto the substrate was bent and the measurement was taken to determine the bending amount of the substrate whenever the package lid and package base were separated from each other.

Figure 3B:
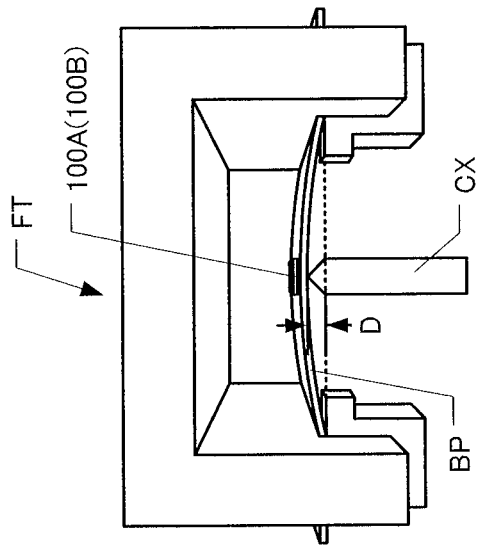
FIG. 3B is a perspective view of the quartz-crystal vibrating device after performing the experiment to determine the bonding strength.
Figure 3A:
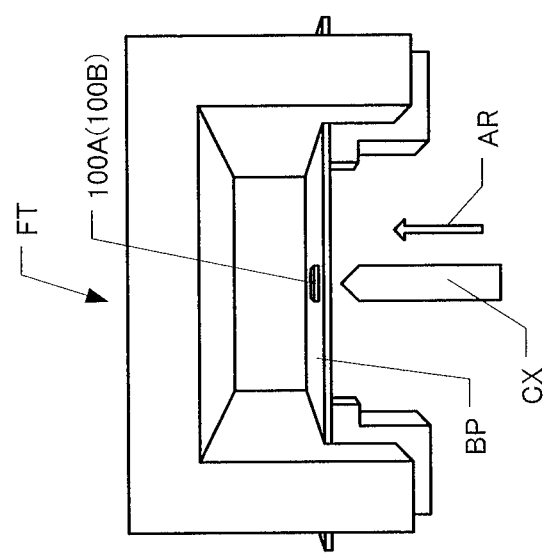
FIG. 3A is a perspective view of the quartz-crystal vibrating device before performing the experiment to determine the bonding strength.

FIG. 3A is a perspective view of the quartz-crystal vibrating device. In this drawing, FIG. 3A is a perspective view before performing the experiment to determine the bonding strength, and FIG. 3B is a perspective view after performing the experiment to determine the bonding strength.

As shown in FIG. 3A, both edges of the substrate BP of the first quartz-crystal vibrating device 100A or 100B bonded using solder is sandwiched and fixed to a fixture FT. Then, a portion of the substrate BP bonded to the quartz-crystal vibrating device 100A or 100B is pressed using the pressing material CX, as indicated with arrow AR in the figure.

Thus, as shown in FIG. 3B, the substrate BP is bent in an arch form. The amount pressed using pressing material CX for deforming the substrate BP is referred as bending amount D. The bending amount D refers to the distance between the position of the quartz-crystal vibrating device 100A or 100B before pressing to the position after pressing.

Thus, the experiment for determining the bending strength of the quartz-crystal vibrating device determines the strength where the package lid and package base of the quartz-crystal vibrating device 100A or 100B separate. The result is as shown in the chart 1 below.

| | | Metal Films | | Average Bending Amount D (mm) of the Substrate |
|---|---|---|---|---|
| No. | Types | Lid | Base | BP (when peeled off) |
| 1 | Quartz-crystal Vibrating Device 100A | No | No | 6.67 |
| 2 | Quartz-crystal Vibrating Device 100B | Yes | Yes | 7.86 |

As shown in chart 1, the metal films are not formed on the bonding surface of the package lid or package base of the quartz-crystal vibrating device 100A. On the other hand, the metal films are formed on the bonding surface of the package lid and package base of the quartz-crystal vibrating device 100B. In the experiment for determining the bending strength of the quartz-crystal vibrating device, the package lid and the package base of the quartz-crystal vibrating device 100A and 100B are bonded using the same type of the low-melting-point glass at the same temperature (400° C.). Here, the bending amount D of the substrate BP at the time of being peeled off refers to the distance of the substrate BP bent whenever the package lid and package base were peeled off (separated). The average value of the bending amount D of the substrate BP at the time of peeled off refers to the average of five bending amounts D after performing experiments for five times, for example.

As understood from the chart 1, the average of the bending amount (7.86 mm) of the substrate BP of the quartz-crystal vibrating device 100B with a metal film formed, is larger than the average of the bending amount (6.67 mm) of the substrate BP of the quartz-crystal vibrating device 100A without a metal film. In other words, whenever a metal film is formed between the package lid and the package base, the bonding strength between the package lid and package base increases, thus reducing the risk of the package lid and the package base of the quartz-crystal vibrating device separating from each other.

<Leakage of the Quartz-Crystal Vibrating Device>

Experiments were performed in order to determine the leakage of vapors from outside into the cavity CT or vice versa, using the quartz-crystal vibrating device 100A without metal film and the quartz-crystal vibrating device 100B with metal film. Chart 2 shows the experiment result of the leakage of quartz-crystal vibrating devices by using seven pieces for each quartz-crystal vibrating devices 100A and 100B. "Leak OK" in the chart refers to the condition without any leakage found. The condition without any leakage found is a leak rate of $1.1 \times 10^{-9}$ Pa·m$^3$/s or lower.

| | | Metal Films | | No. of | | Leak Defect |
|---|---|---|---|---|---|---|
| No. | Types | Lid | Base | Samples | Leak OK | Rate (%) |
| 1 | Quartz-crystal Vibrating Device 100A | No | No | 7 | 5 | 28.6% |
| 2 | Quartz-crystal Vibrating Device 100B | Yes | Yes | 7 | 7 | 0.0% |

As shown in chart 2, out of seven quartz-crystal vibrating devices 100A without metal film, five quartz-crystal vibrating devices 100A passes the leakage experiment, which is indicated as "leak OK" in the chart. Thus, the leak defect rate is 28.6%. On contrary, all seven quartz-crystal vibrating devices 100B with metal film passes the leakage experiment, which is indicated as "leak OK" in the chart. Thus, the leak defect rate is 0%.

As shown in charts 1 and 2, the package lid and the package base on the quartz-crystal vibrating device 100B are less likely to be peeled off (separated) from each other, and the quartz-crystal vibrating device 100B has less vapor leakage from outside into the cavity CT or vice versa, in comparison to the quartz-crystal vibrating device 100A.

In the first quartz-crystal vibrating device 100 in the first embodiment, although the rough surface is formed only on the bonding region EA of the second peripheral surface M2, it can be applied to the quartz-crystal vibrating device having rough surface on entire second peripheral surface M2. Also, although the metal films are formed on both package lid 11 and package base 12 in the first embodiment, the metal film can be situated only on one of the respective surfaces M1, M2.

Further, in the first quartz-crystal vibrating device 100, the second peripheral surface M2 on the package base 12 is formed wider than the first peripheral surface M1 on the package lid 11, so as to leave room to dispose the piezoelectric vibrating piece 10 on the second peripheral surface M2 of the package base 12. However, it can be applied to the quartz-crystal vibrating device having the same width of the first peripheral surface M1 and second peripheral surface M2, with the piezoelectric vibrating piece 10 mounted inside the base recess 121 of the package base. Also, whenever the piezoelectric vibrating piece 10 is mounted onto the base recess 121 of the package base 12, the package lid can be a planar plate without a recess.

Furthermore, on the first quartz-crystal vibrating device 100, a groove can be formed on the second peripheral surface M2 of the package base 12, so as to prevent the overflowing low-melting-point glass LG from entering between the bonding region EA and electrically conductive adhesive 13.

<Manufacturing Method of the First Quartz-Crystal Vibrating Device 100>

Figure 4:
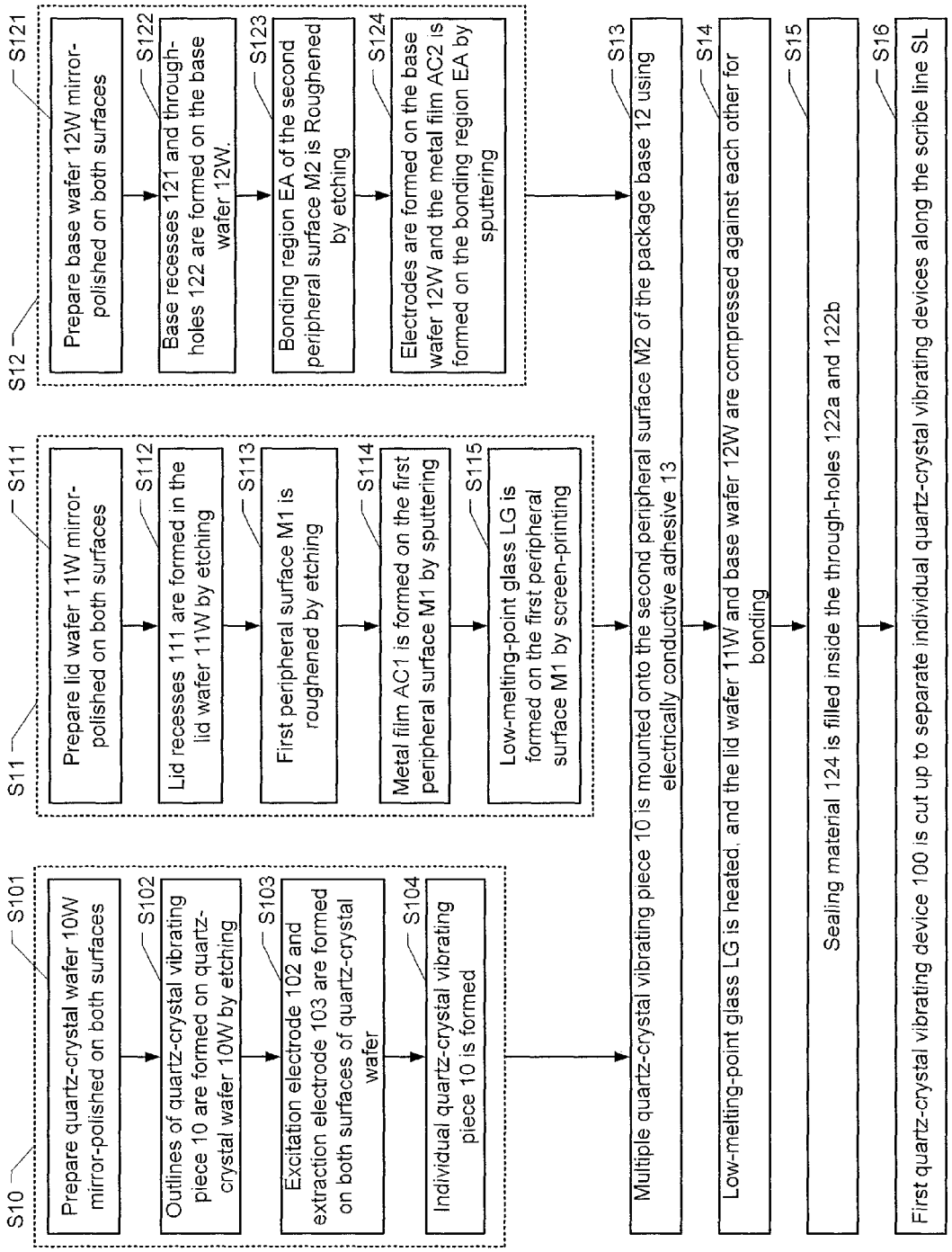
FIG. 4 is a flow-chart showing the manufacturing method of the first quartz-crystal vibrating device 100.
Figure 5:
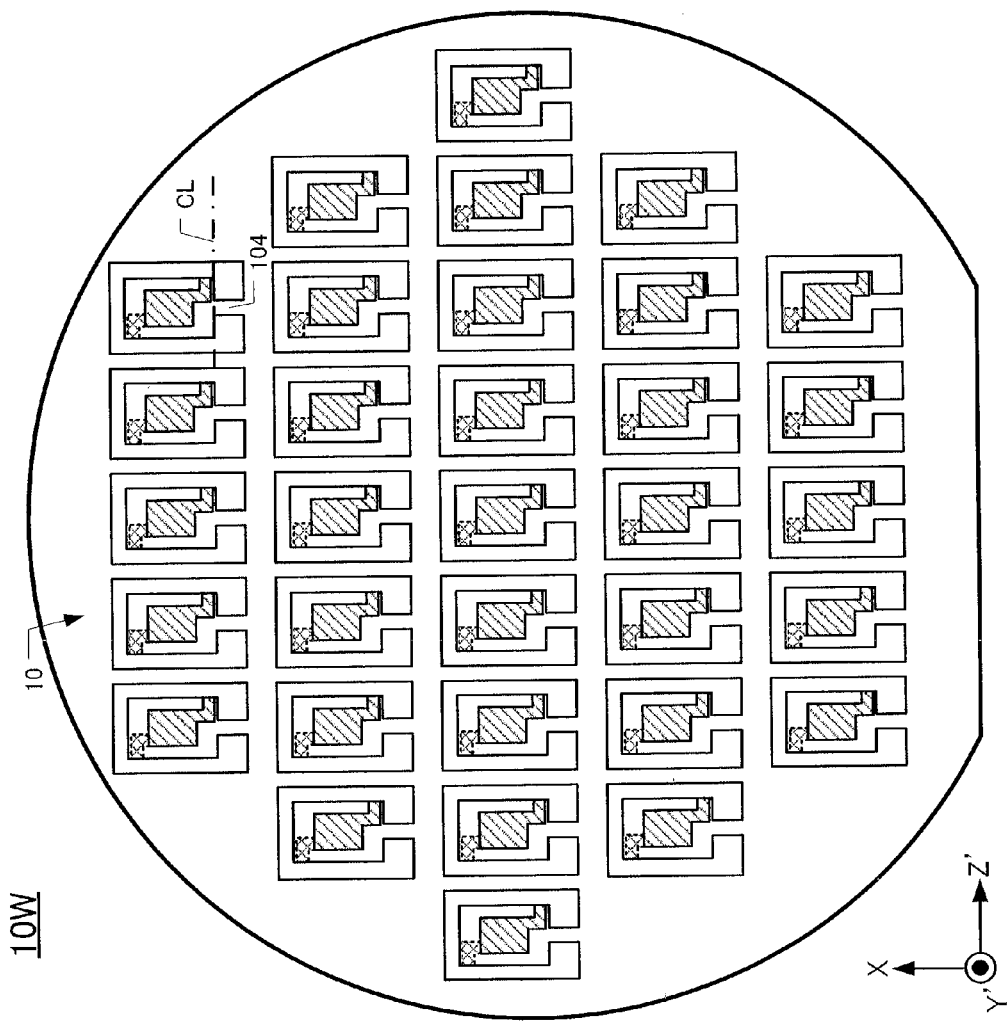
FIG. 5 is a plan view of the quartz-crystal wafer 10W.
Figure 6:
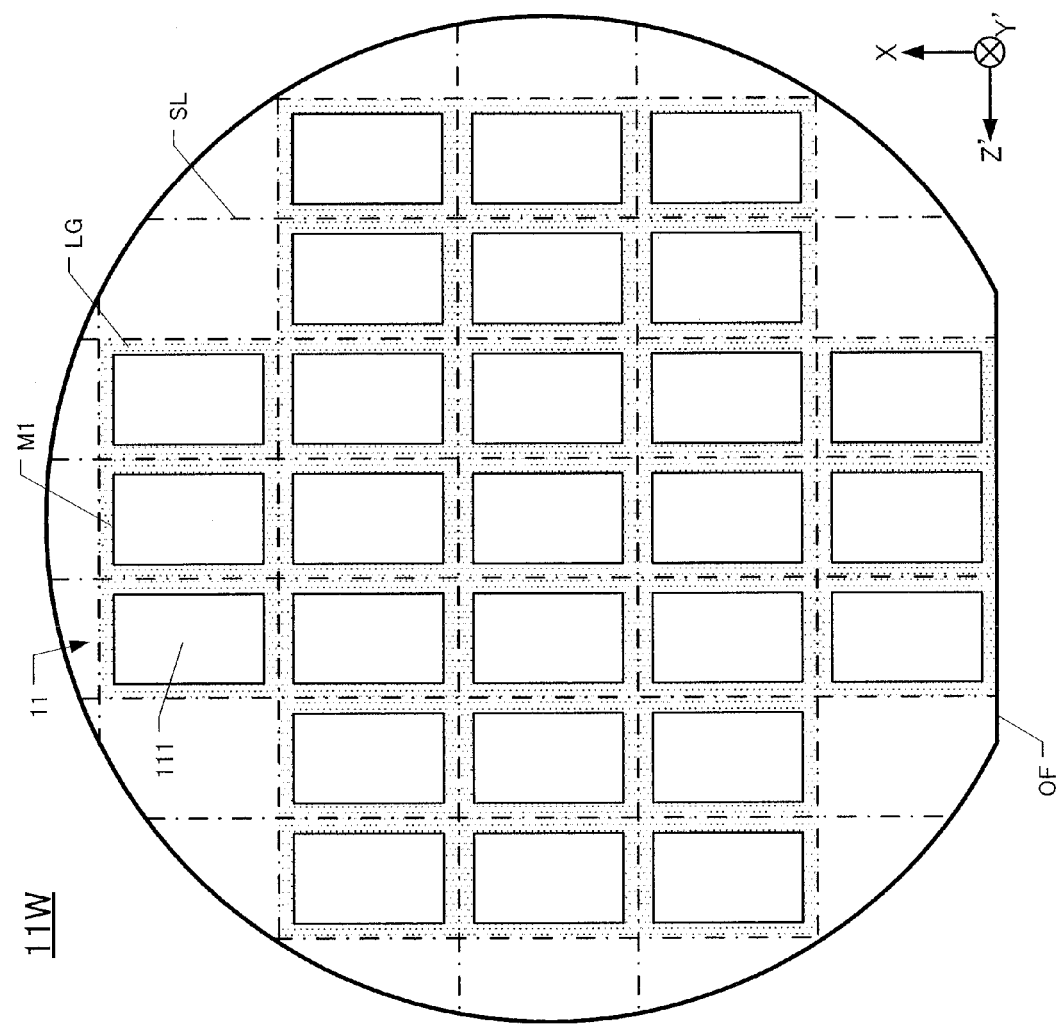
FIG. 6 is a plan view of the quartz-crystal wafer 11W.
Figure 7:
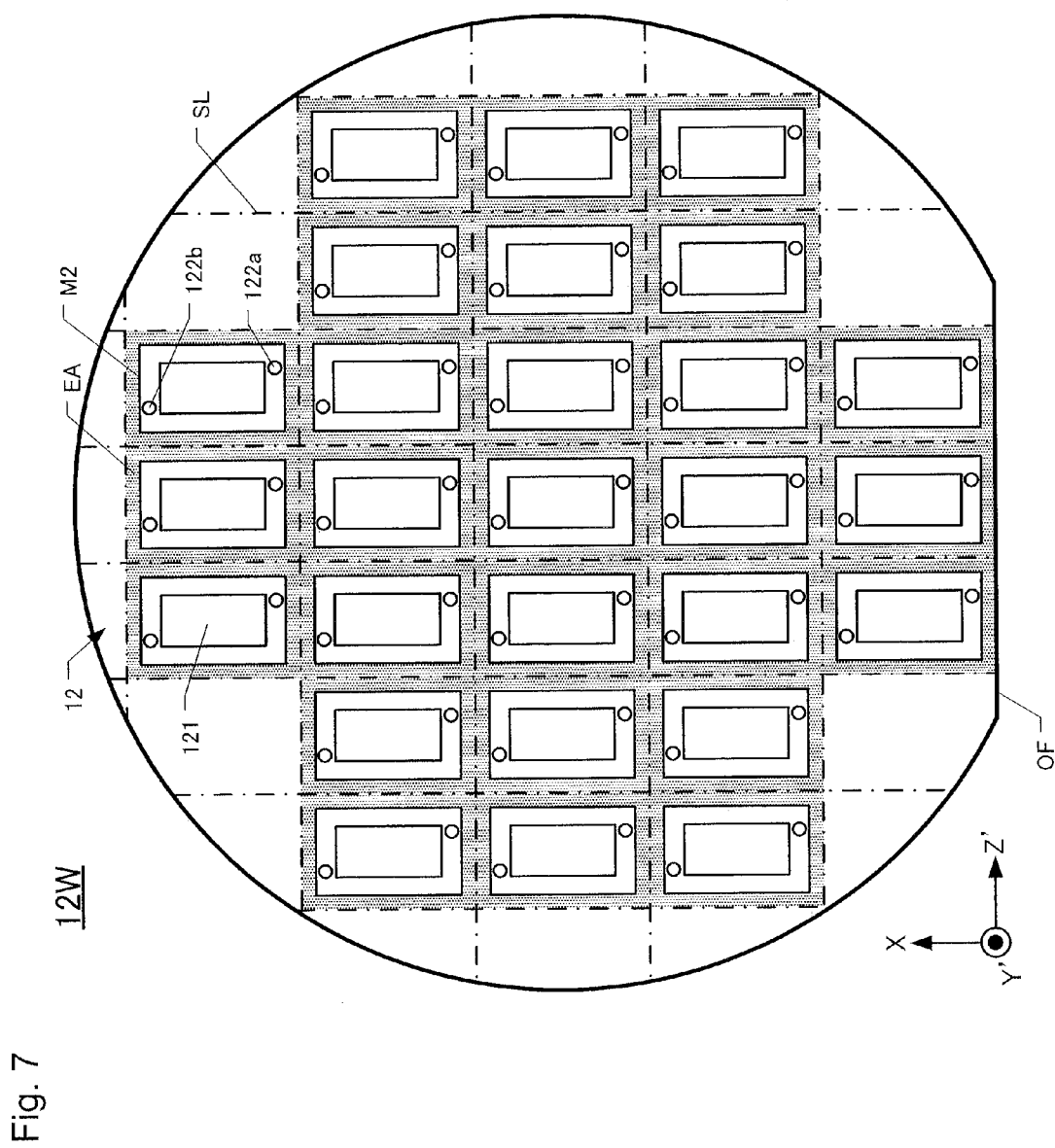
FIG. 7 is a plan view of the base wafer 12W.

FIG. 4 is a flow-chart of an embodiment of a method for manufacturing the first embodiment of a first quartz-crystal vibrating device 100. In FIG. 4, the protocol S10 for manufacturing the quartz-crystal vibrating piece 10, the protocol S11 for manufacturing the package lid 11, and the protocol S12 for manufacturing the package base 12 can be carried out separately or in parallel. FIG. 5 is a plan view of the quartz-crystal wafer 10W, FIG. 6 is a plan view of the lid wafer 11W, and FIG. 7 is a plan view of the base wafer 12W.

In protocol S10, the quartz-crystal vibrating piece 10 is manufactured. The protocol S10 includes steps S101 to S104.

In step S101, a quartz-crystal wafer 10W, mirror-polished on both sides, is prepared. A half-finished quartz-crystal wafer (not drawn), obtained by an AT-cut from a raw quartz-crystal, have, a rough surface, convexities and concavities on entire surface. If a half-finished quartz-crystal wafer is used as it is, a rough surface with convexities and concavities causes diffused reflection during the photoresist using the exposing tool, thus making the formation of outlining difficult. Therefore, the quartz-crystal wafer 10W is manufactured by mirror-polishing both surfaces of the half-finished AT-cut quartz-crystal wafer obtained by polishing the raw quartz-crystal material.

In step S102, as shown in FIG. 5, outlines of the plurality of quartz-crystal vibrating piece 10 are formed on a planer quartz-crystal wafer 10W by etching. Here, each quartz-crystal vibrating piece 10 is connected to the quartz-crystal wafer 10W by a joining portion 104.

In step S103, a foundation layer of chromium and overlaying gold layer is applied onto both surfaces and side surfaces of the quartz-crystal wafer 10W by sputtering or vacuum-deposition. Then, a photoresist is uniformly applied onto entire surface of the metal layer. Using an exposure tool (not shown), outline patterns of the excitation electrodes 102a and 102b, and extraction electrodes 103a and 103b drawn on the photomask are exposed on the quartz-crystal wafer 10W. Next, the metal layer exposed from photoresist is etched. Thus, as shown in FIG. 5, excitation electrodes 102a and 102b, and extraction electrodes 103a and 103b are formed on both surfaces and side surfaces of the quartz-crystal wafer 10W (refer to FIG. 1).

In step S104, individual quartz-crystal vibrating pieces 10 are cut into separate pieces. During cutting, quartz-crystal vibrating pieces 10 are cut along cut lines CL (denoted by dot-dash lines in FIG. 6) using a dicing unit such as a laser beam or dicing saw.

In protocol S11, the package lid 11 is manufactured. Protocol S11 includes steps S111 to S115.

In step S111, a lid wafer 11W, mirror-polished on both surfaces, is prepared. Whenever a quartz-crystal material is used as the lid wafer 11W, both surfaces of the half-finished lid wafer, obtained from a raw quartz-crystal material by AT-cut or Z-cut, is mirror-polished with an abrasive.

In step S112, as shown in FIG. 6, several hundreds to several thousands of lid recesses 111 are formed on the lid wafer 11W, a circular, uniformly planar plate of quartz-crystal material. The lid recesses 111 are formed in the lid wafer 11W by etching or mechanical processing, leaving the first peripheral surfaces M1 around the lid recesses 111.

In step S113, the first peripheral surface M1 is etched or sand-blasted, roughening first surface by Ra 10 μm to Ra 40 μm (refer to FIG. 2).

In step S114, the first metal film AC1 comprising the chromium layer and the gold layer is formed on the first peripheral surface M1 by sputtering and etching method explained in step S103.

In step S115, as shown in FIG. 6, the low-melting-point glass LG is imprinted on the metal film AC1 of the first peripheral surface M1 of the lid wafer 11W by screen-printing. Then, the low-melting-point glass LG is formed on the first peripheral surface M1 of the lid wafer 11W by preliminary curing.

In protocol S12, the package base 12 is manufactured. Protocol S12 includes steps S121 to S124.

In step S121, the base wafer 12W, mirror-polished on both surfaces, is prepared. Whenever a quartz-crystal material is used as the base wafer 12W, both surfaces of the half-finished lid wafer obtained from a raw quartz-crystal material by AT-cut or Z-cut, are mirror-polished using an abrasive.

In step S122, as shown in FIG. 7, several hundreds to several thousands of lid recesses 111 are formed on the lid wafer 11W, a circular, uniformly planar plate of quartz-crystal material. The base recesses 121 are formed in the base wafer 12W by etching or mechanical processing, leaving the second peripheral surfaces M2 around the base recesses 121. Also formed are respective through-holes 122a and 122b on each edge of the package base 12 in respective X-axis directions. The through-holes extend depthwise through the base wafer 12W.

In step S123, the bonding region EA of the second peripheral surface M2 is etched or sand-blasted, roughening the surface by Ra 10 μm to Ra 40 μm (refer to FIG. 2).

In step S124, as shown in FIG. 2, external electrodes 125a and 125b are formed on the mounting surface of package base 12 (mounting surface of quartz-crystal vibrating device), and respective through-hole electrodes 123a and 123b are formed on the through-holes 122a and 122b, by etching and sputtering (the same method as used in step S102). Simultaneously, the metal film AC2, comprising the chromium layer and gold layer, is formed on the bonding region EA of the second peripheral surface M2.

In step S13, the quartz-crystal vibrating piece 10 (manufactured in protocol S10) is mounted onto the second peripheral surface M2 of the package base 12 using electrically conductive adhesive 13. The quartz-crystal vibrating piece 10 is mounted onto the second peripheral surface M2 of the package base 12, so as to align the extraction electrodes 103a and 103b on the quartz-crystal vibrating piece 10 with respective connecting pad 123M formed on the second peripheral surface M2 of the package base 12 (refer to FIG. 2).

In step S14, the low-melting-point glass LG is heated, and the lid wafer 11W and base wafer 12W are compressed against each other for bonding via the low-melting-point glass LG.

In step S15, the eutectic alloy 124 (refer to FIG. 2) made of gold tin (Au—Sn) alloy, gold germanium (Au—Ge) or gold silicone (Au—Si) is filled inside the through-holes 122a and 122b. The eutectic alloy 124 is melted in a vacuum or reflow chamber filled with inert gas, for sealing the wafers. Thus the multiple first quartz-crystal vibrating devices 100 having a cavity under a vacuum or filled with an inert-gas is prepared.

In step S16 the bonded-together lid wafer 11W and base wafer 12W is cut up to separate individual quartz-crystal vibrating devices 100 from the wafer and from each other. This cutting is performed by cutting along scribe lines SL, denoted by dot-dash lines in FIGS. 6 and 7, using a dicing unit such as a laser beam or a dicing saw. Thus, several hundreds to several thousands of quartz-crystal vibrating devices 100 are produced.

Second Embodiment

Overall Configuration of the Second Quartz-Crystal Vibrating Device 200

The general configuration of a second quartz-crystal vibrating device 200 is described below with reference to FIGS. 8 to 10.

Figure 8:
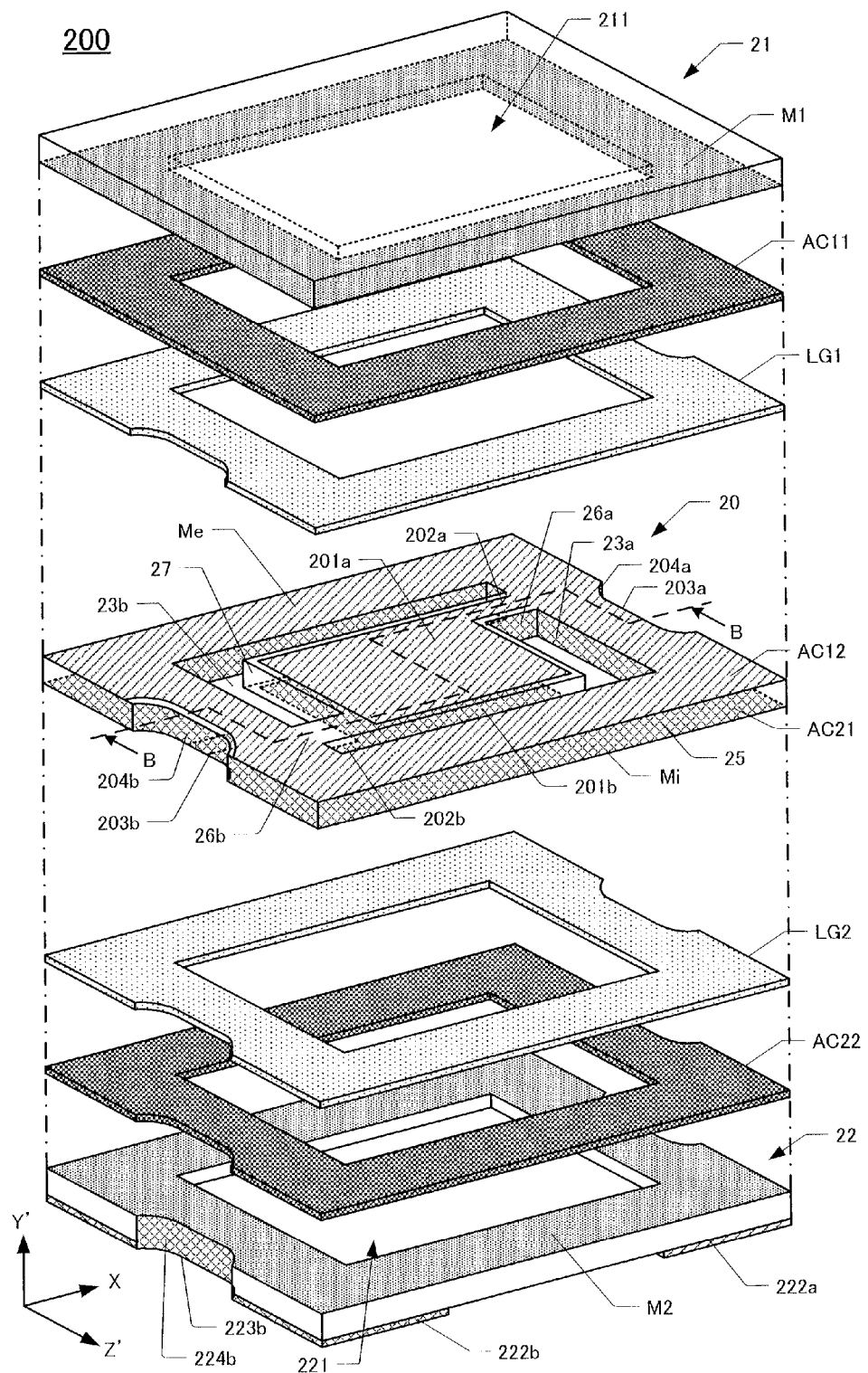
FIG. 8 is an exploded perspective view of the second quartz-crystal vibrating device 200. Connecting electrodes 14a and 14b are omitted from the drawing.

FIG. 8 is an exploded perspective view of the second quartz-crystal vibrating device 200, and the connecting electrodes 14a and 14b are omitted from the drawing. FIG. 9 is a cross-sectional view of FIG. 8 taken along B-B line of FIG. 8. FIG. 10A is a plan view of the first surface Me of the quartz-crystal frame 20 as viewed from the +Y'-axis side, FIG. 10B is a plan view of the second surface Mi of the quartz-crystal frame 20 as viewed from the −Y'-axis side, and FIG. 10C is a plan view of the package base 22 as viewed from +Y'-axis side.

Figure 9:
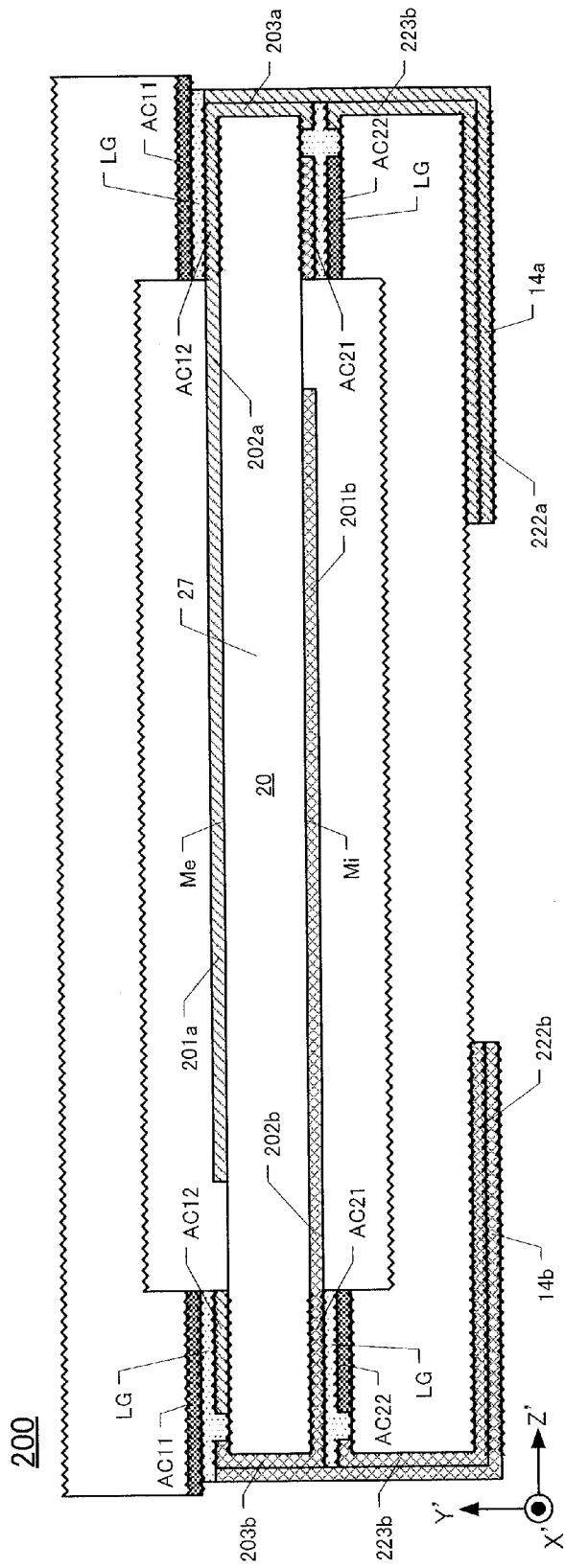
FIG. 9 is a cross-sectional view of FIG. 8 taken along B-B line.
Figure 10A:
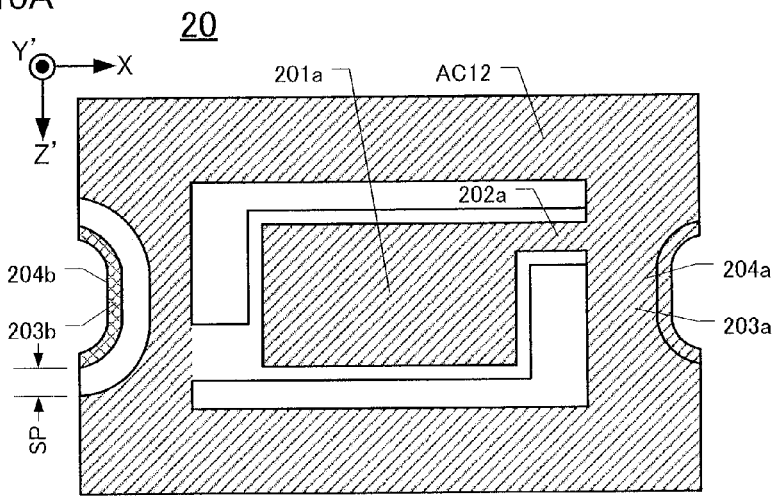
FIG. 10A is a plan view of the first surface Me of the quartz-crystal frame 20, viewed from the +Y'-axis side.
Figure 10B:
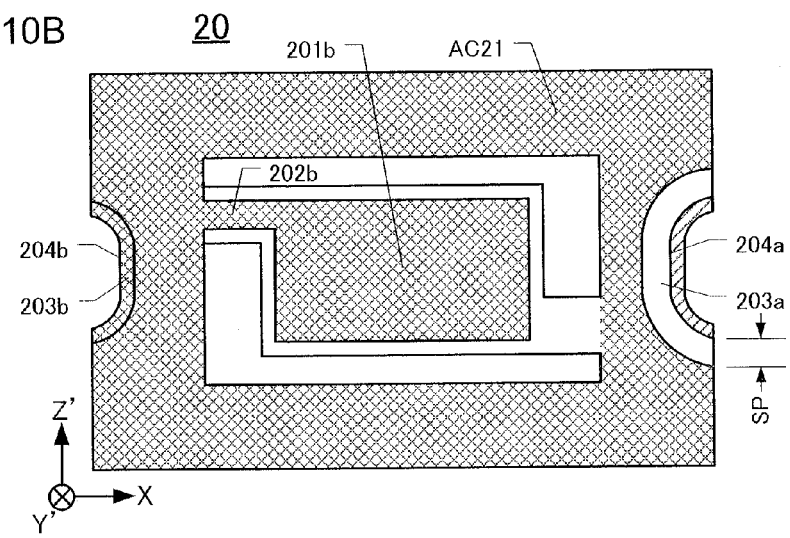
FIG. 10B is a plan view of the second surface Mi of the quartz-crystal frame 20, viewed from the −Y'-axis side.
Figure 10C:
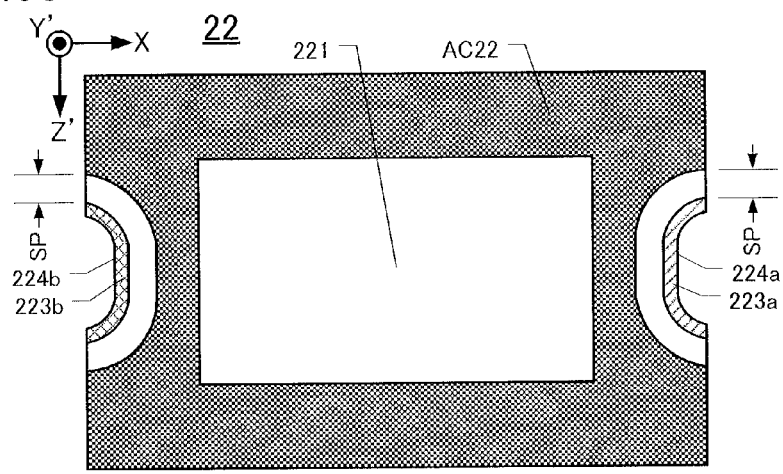
FIG. 10C is a plan view of the package base 22 viewed from the +Y'-axis side.

As shown in FIGS. 8 and 9, the second quartz-crystal vibrating device 200 comprises a rectangular package lid 21 defining a lid recess 211 configured as a concavity in the inner main surface of the package lid 21, a package base 22 defining a base recess 221 in the inner main surface of the package base 12, and an AT-cut quartz-crystal frame 20 sandwiched between the package lid 21 and package base 22. The package lid 21 has same configuration as the package lid 11 explained in the first embodiment.

The quartz-crystal frame 20 has a first surface Me and a second surface Me opposing the first surface, and comprises a quartz-crystal vibrating portion 27, having respective excitation electrodes 201a and 201b on both surfaces, and an outer frame 25 surrounding the quartz-crystal vibrating portion 27. Between the quartz-crystal vibrating portion 27 and the outer frame 25, a pair of joining portions 26a and 26b are formed along the quartz-crystal vibrating portion 27 in both X-axis directions, which connects to the outer frame 25. Between the quartz-crystal vibrating portion 27 and the outer frame 25, two "L-shaped" gaps 23a and 23b are formed. An extraction electrode 202a is formed on the first surface Me of the joining portion 26a, which extends from the excitation electrode 201a, and an extraction electrode 202b is formed on the second surface Mi of the joining portion 26a, which extends from the excitation electrode 202b.

Figure 12:
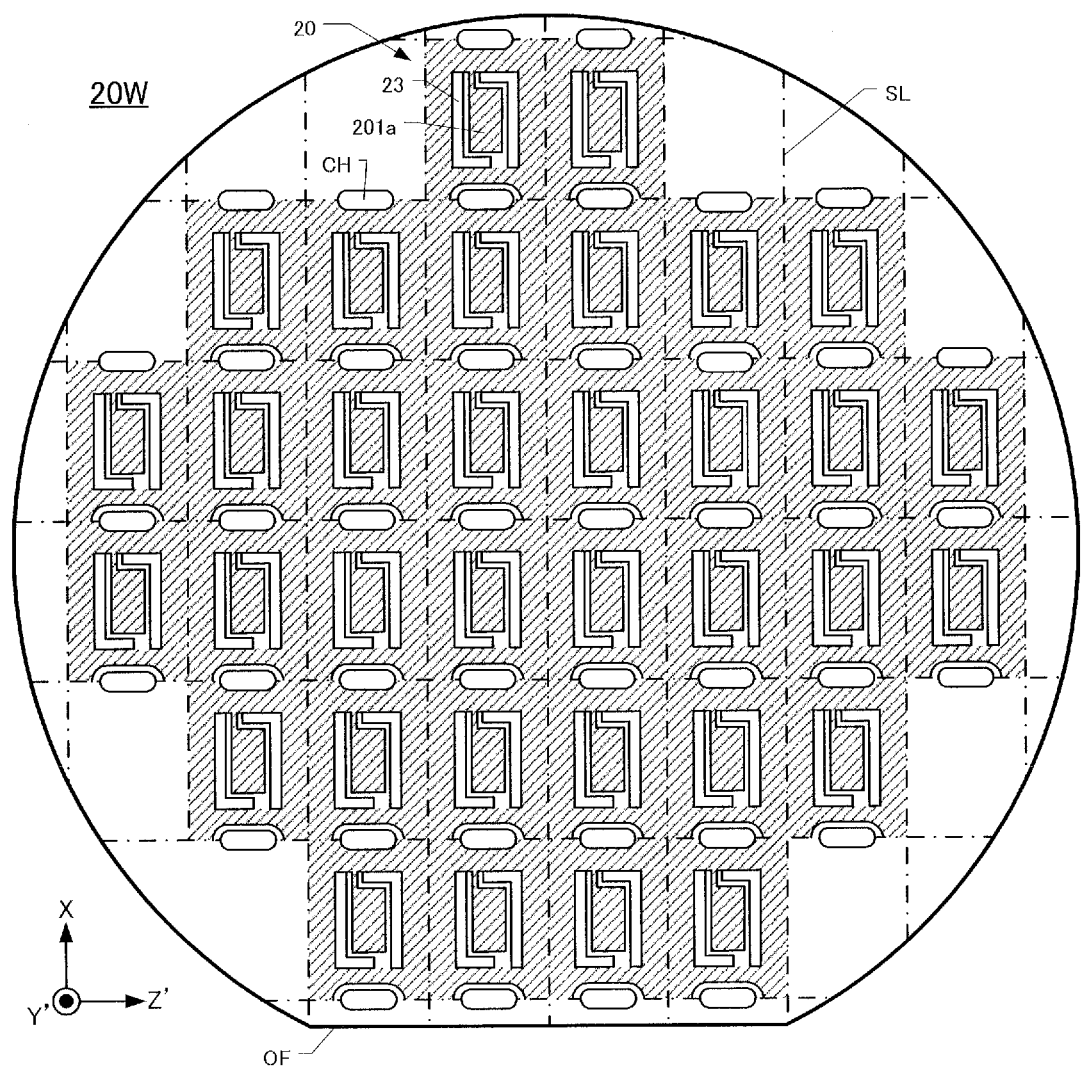
FIG. 12 is a plan view of the quartz-crystal wafer 20W.

Respective quartz-crystal castellations 204a and 204b are formed on both sides extending in the Z'-axis directions of the quartz-crystal frame 20 in respective X-axis directions, which is formed as the rounded-rectangular quartz-crystal through-holes CH (refer to FIG. 12). Respective quartz-crystal side surface electrodes 203a and 203b are formed on quartz-crystal castellations 204a and 204b.

The first surface Me and the second surface Mi of the outer frame 25 is a rough surface having roughness Ra of 10 μm to 40 μm. On the first surface Me and the second surface Mi, respective metal films AC12 and AC21 are formed, which are electrically connected to extraction electrodes 202a and 202b. Thus the extraction electrode 202a is connected to the quartz-crystal side surface electrode 203a via the metal film AC12, and the extraction electrode 202b is connected to the quartz-crystal side surface electrode 203b via the metal film AC21. The first metal film AC12 and AC21 comprises a foundation layer of chromium (Cr) and overlaying gold (Au) layer. An exemplary thickness of the chromium layer is approximately 500 Å, and an exemplary thickness of the gold layer is in the range of 1,500 Å to 2,500 Å. Here, rough surface of the first surface Me and second surface Mi for forming metal films AC12 and AC21 allows strong adhesion of metal films AC12 and AC21 to the respective surfaces Me and Mi.

Here, whenever an alternating voltage (voltage that alternates positives and negatives) to the external electrodes 222a and 222b, the quartz-crystal side surface electrodes 203a and 203b, and the excitation electrodes 201a and 201b, form different polarity. Therefore, metal films AC12 and AC21 are formed so as to prevent electrodes having different polarities from electrical short.

The metal film AC12 connects the excitation electrode 201a and the quartz-crystal side surface electrode 203a, and the metal film AC21 connects the excitation electrode 201b and the quartz-crystal side surface electrode 203b. As shown in FIG. 10A, the metal film AC12 connected to the excitation electrode 201a is formed at a predefined distance SP away from the quartz-crystal side surface electrode 203b, so as to prevent a short with the quartz-crystal side surface electrode 203b connected to the excitation electrode 201b. Similarly, as shown in FIG. 10B, the metal film AC21 connected to the excitation electrode 201b is formed at a predefined distance SP away from the quartz-crystal side surface electrode 203a, so as to prevent a short with the quartz-crystal side surface electrode 203a connected to the excitation electrode 201a.

Going back to FIGS. 8 and 9, the second quartz-crystal vibrating device 200 further comprises a package base 22 having a second peripheral surface M2 surrounding the base recess 221 and fabricated from the quartz-crystal material. The cavity CT is formed for situating the quartz-crystal vibrating portion 27 with the package lid 21 and the outer frame 25 of the quartz-crystal frame 20. The cavity CT is filled with inert gas or under a vacuum.

A pair of external electrodes 222a and 222b is formed on the mounting surface (mounting surface of the quartz-crystal vibrating device) on both sides in respective X-axis directions of the package base 22. The base castellations 224a and 224b are formed on both ends of the package base 22 in respective X-axis directions, so as to correspond to the quartz-crystal castellations 204a and 204b of the quartz-crystal frame 20. The base castellations 224a and 224b are formed simultaneously with the rounded-rectangular base through-holes BH (refer to FIG. 14). On the base castellations 224a, a base side surface electrode 223a is formed, in which one end is connected to the external electrode 222a, and the other end is connected to the quartz-crystal castellations 204a of the quartz-crystal frame 20. Similarly, on the base castellations 224b, a base side surface electrode 223b is formed, in which one end is connected to the external electrode 222b, and the other end is connected to the metal film AC21 of the quartz-crystal frame 20.

Thus, the excitation electrodes 201a and 201b are connected to the respective external electrodes 222a and 222b through the extraction electrode 202a and 202b, metal films AC12 and AC21, quartz-crystal side surface electrode 203a and base side surface electrodes 223a and 223b.

The second peripheral surface M2 of the package base 22 is a rough surface having surface roughness Ra of 10 μm to 40 μm. On the second peripheral surface M2, a metal film AC22 is formed, which comprises a foundation layer of chromium (Cr) and overlaying gold (Au). An exemplary thickness of the chromium layer is approximately 500 Å, and an exemplary thickness of the gold layer is in the range of 1,500 Å to 2,500 Å. Here, the rough surface of the second peripheral surface M2 for forming the metal film AC22 increases the adhesion of metal film AC22 to the second peripheral surface M2.

Here, the metal film AC22 is formed, so as to prevent the package base side surface electrode 223a and the base side surface electrode 223b from electric short. Specifically, as shown in FIG. 10C, the metal film AC22 is formed at a predetermined distance SP away from respective base side surface electrodes 223a and 223b, so as to prevent electrical short. Although the metal film AC22 is formed at a predetermined distance SP away from both base side surface electrodes 223a and 223b, at least one electrode can be connected to the metal film AC22.

Going back to FIGS. 8 and 9, the package lid 21 and the quartz-crystal frame 20 are bonded using the low-melting-point glass LG, a sealing material for the metal films AC11 and AC12. Similarly, the quartz-crystal frame 20 and the package base 22 are bonded using the low-melting-point glass LG, a sealing material for the metal films AC21 and AC22.

In the second quartz-crystal vibrating device 200, the metal film AC11 is formed on the rough surface of the package lid 11, the metal films AC12 and AC21 are formed on both rough surfaces of the quartz-crystal frame 20, and the metal film AC22 is formed on the rough surface of the package base 22, thus providing stronger bonding strength. Thus the package lid 21, the quartz-crystal frame 20 and the package base 22 are ensured to be reliably bonded (refer to chart 1). Further, since the package lid 21, the quartz-crystal frame 20 and the package base 22 are ensured to be bonded, thus creating greater resistance to leakage into or out of the quartz-crystal vibrating device 200 (refer to chart 2).

As shown in FIG. 9, the connecting electrodes 14a and 14b of the second quartz-crystal vibrating device 200 are formed, so as to cover entire or part of the external electrodes 222a and 222b, the base side surface electrodes 223a and 223b, and the quartz-crystal side surface electrode 203a and 203b. Thus, the connecting electrodes 14a and 14b are ensured to be connected to the quartz-crystal side surface electrode 203a and the base side surface electrode 223a, in which the low-melting-point glass LG could not connect, as well as the metal film AC21 and the base side surface electrode 223b. Therefore, the external electrodes 222a and 222b are ensured to be electrically connected to the excitation electrodes 201a and 201b.

In the second quartz-crystal vibrating device 200, although the quartz-crystal castellations and the base castellations are illustrated as rounded-rectangular castellations formed on opposite ends in the X-axis direction of the quartz-crystal frame and the package base, the castellations can take the form of quarter-rounded castellations formed on each corner of the quartz-crystal frame and the package base.

<Manufacturing Method of the Second Quartz-Crystal Vibrating Device 200>

Figure 11:
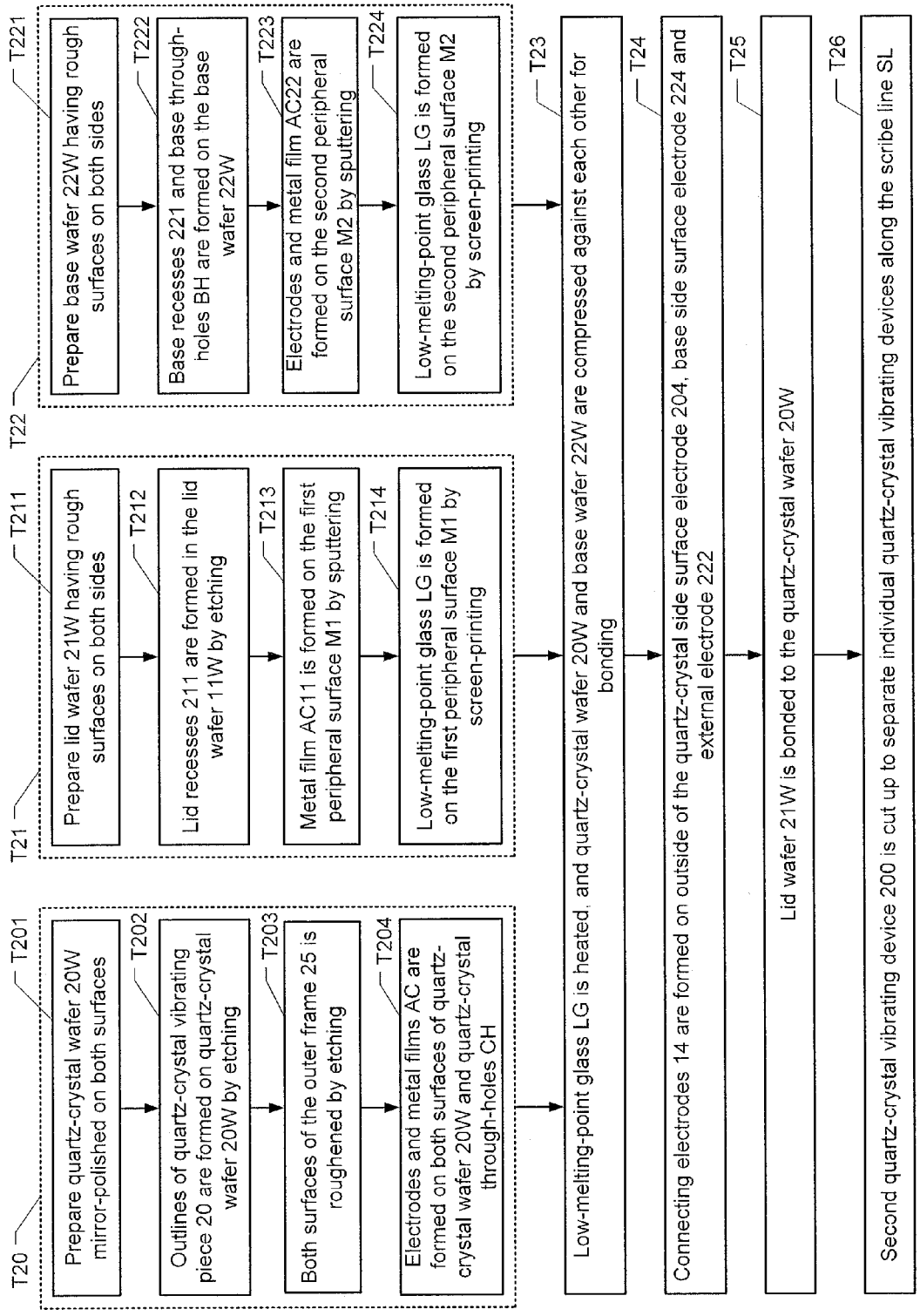
FIG. 11 is a flow-chart showing the manufacturing step of the second quartz-crystal vibrating device 200.
Figure 13:
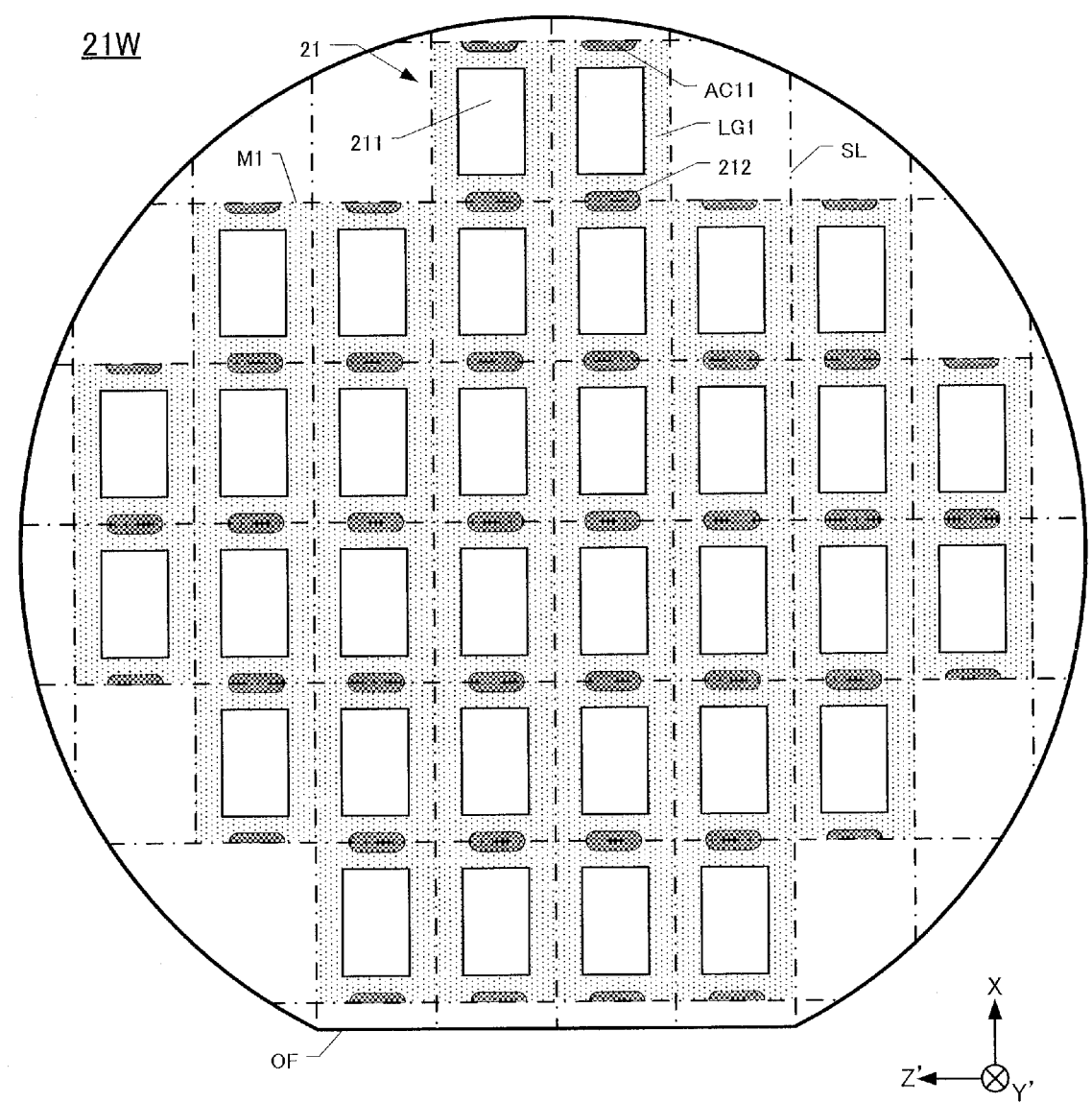
FIG. 13 is a plan view of the lid wafer 21W.
Figure 14:
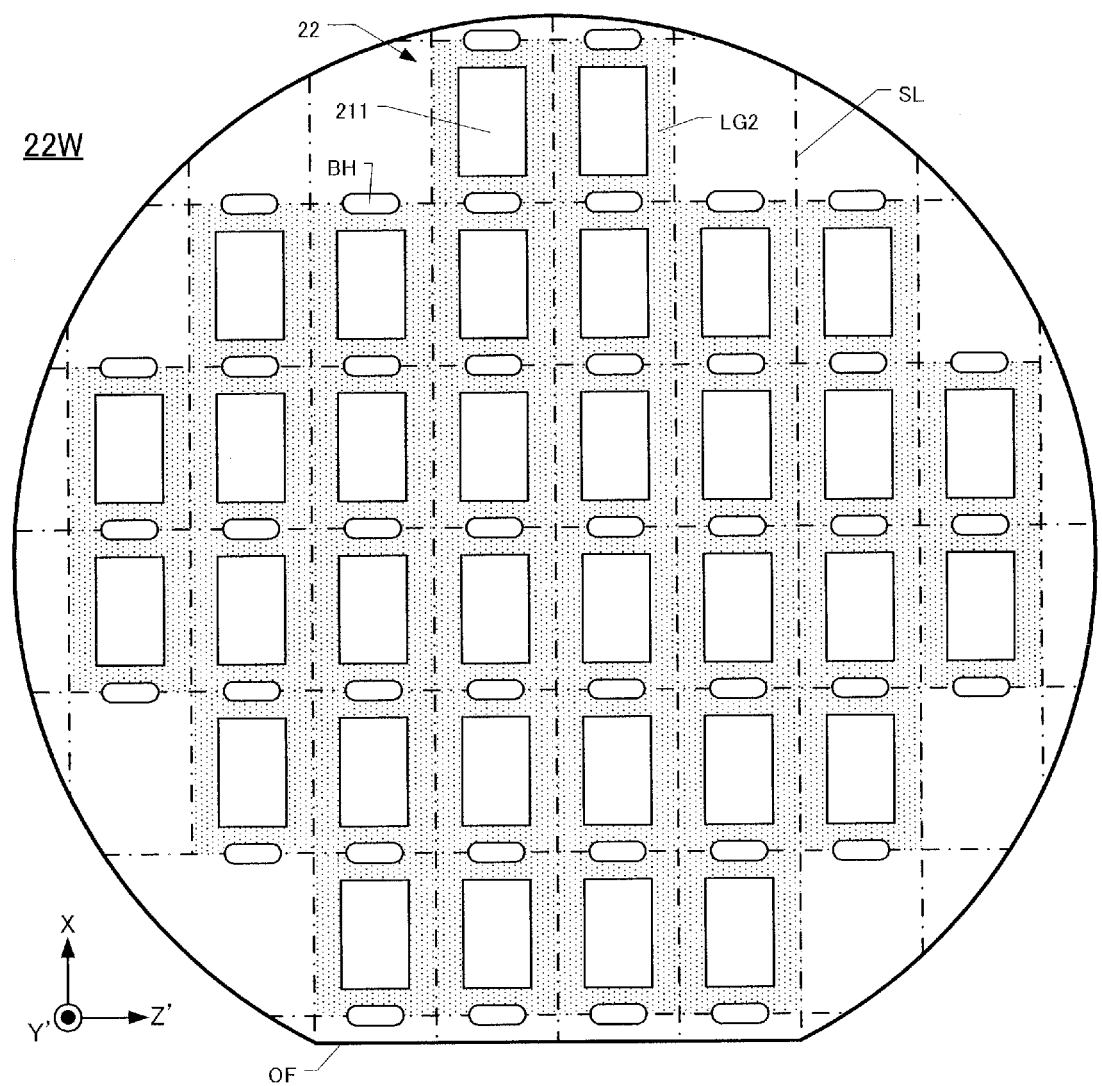
FIG. 14 is a plan view of the base wafer 22W.

FIG. 11 is a flow-chart showing the manufacturing method of the second quartz-crystal vibrating device 200. In FIG. 11, the protocol T20 for manufacturing the quartz-crystal frame 20, the protocol T21 for manufacturing the package lid 21 and the protocol T22 for manufacturing the package base 22 can be carried out separately or in parallel. FIG. 12 is a plan view of the quartz-crystal wafer 20W in the second embodiment, FIG. 13 is a plan view of the lid wafer 21W in the second embodiment and FIG. 14 is a plan view of the base wafer 22W in the second embodiment.

In protocol T20, the quartz-crystal frame 20 is manufactured. Protocol T20 includes steps T201 to T203.

In step T201, a quartz-crystal wafer 20W, mirror-polished on both sides is prepared.

In step T202, as shown in FIG. 12, outlines of a plurality of quartz-crystal frames 20 are formed on the quartz-crystal wafer 20W, uniformly planar plate of quartz-crystal material, by etching. Thus, the quartz-crystal vibrating portion 27, the outer frame 25 and the gap portion 23 are formed. Rounded-rectangular quartz-crystal through-holes CH are formed simultaneously on each quartz-crystal frame 20 on opposite ends in the X-axis direction. When a quartz-crystal through-hole CH is divided in half, it forms one quartz-crystal castellation 204 (refer to FIG. 8).

In step T203, the first surface Me and the second surface Mi of the outer frame 25 are etched or sand-blasted, roughening first surface by Ra 10 μm to Ra 40 μm (refer to FIG. 9).

In step T204, a metal layer is formed on both surfaces of the quartz-crystal wafer 20W and quartz-crystal through-holes CH by sputtering or vacuum-deposition. Next, a photoresist is uniformly applied on entire surface of the metal layer. Using an exposure tool (not shown), exposed patterns of the excitation electrodes 201a and 201b, extraction electrodes 202a and 202b, metal film AC12 and AC21, and quartz-crystal side surface electrodes 203a and 203b, are exposed onto the quartz-crystal wafer 20W. Next, the metal layer exposed from photoresist is etched. Thus, shown in FIGS. 8 and 9, the excitation electrodes 201a and 201b, extraction electrodes 202a and 202b, and metal films AC12 and AC21 are formed on both surfaces of the quartz-crystal wafer 20W, and the quartz-crystal side surface electrodes 203a and 203b are formed on the quartz-crystal through-holes CH.

In protocol T21, the package lid 21 is manufactured. Protocol T21 includes steps T211 to T214.

In step T211, a lid wafer 21W, having rough surface on both surfaces, is prepared. A half-finished lid wafer (not drawn), obtained by an AT-cut from a raw quartz-crystal, have sharp convexities and concavities on entire surface. If a half-finished lid wafer is used as it is, a rough surface with sharp convexities and concavities causes diffused reflection during the photoresist using the exposing tool (as processed in step S213, for example), thus making the formation of outlining difficult. Therefore, the half-finished lid wafer (not drawn), having rough surface of sharp convexities and concavities, is wet-etched. This makes the sharp convexities and concavities smooth, prevents diffused reflection, and allows forming the exposing patterns more precisely. Although both surfaces of the lid wafer 21W are wet-etched in step T211, it can be etched only on one side.

In step T212, as shown in FIG. 13, several hundreds to several thousands of lid recesses 211 are formed on the lid wafer 21W, a circular, uniformly planar plate of quartz-crystal material. The first peripheral surfaces M1 are formed around the lid recesses 211.

In step T213, the metal film AC11 is formed on entire surface of the first peripheral surface M1 by sputtering and etching, a same method as used in step T203.

In step T214, as shown in FIG. 13, a low-melting-point glass LG is imprinted of the metal film AC11 formed on the first peripheral surface M1 of the lid wafer 21W by screen-printing. The low-melting-point glass LG is not formed on the corresponding position 212, corresponding to the quartz-crystal through-holes CH (quartz-crystal castellations 204).

In protocol T22, the package base 22 is manufactured. Protocol T22 includes steps T221 to T224.

In step T221, as similar to step T211, a base wafer 22W having rough surface on both surfaces is prepared.

In step T222, as shown in FIG. 14, several hundreds to several thousands of base recesses 221 are formed on the base wafer 22W, a uniformly thick, planar quartz-crystal plate. The second peripheral surface M2 is formed surrounding the base recess 221. Also the rounded-rectangular through-holes BH are formed on each end of the package base 22 in both X-axis directions. The base through-holes BH extend depthwise through the base wafer 22W. When a base through-hole BH is divided in half, it forms one base castellation 224 (refer to FIG. 8).

In step T223, the metal film AC22 is formed on the second peripheral surface M2 by sputtering and etching (same method as used in step T203). The base side surface electrodes 223a and 223b are formed on the base through-holes BH, and the external electrodes 222a and 222b are formed on the mounting surface (mounting surface of the piezoelectric device) of the base wafer 22W.

In step T224, as shown in FIG. 14, the low-melting-point glass LG is imprinted on the metal film AC22 formed on the second peripheral surface M2 of the base wafer 22W, by screen-printing.

In step T23, the low-melting-point glass LG is heated and the quartz-crystal wafer 20W and the base wafer 22W are compressed against each other. The quartz-crystal wafer 20W and the base wafer 22W are bonded via the low-melting-point glass LG.

In step T24, a pair of connecting electrodes 14a and 14b is formed, so as to cover the external electrodes 222a and 222b, the base side surface electrodes 223a and 223b, and the quartz-crystal side surface electrodes 203a and 203b. Specifically, the bonded quartz-crystal wafer 20W and the base wafer 22W are placed on the table (not shown), with the quartz-crystal wafer 20W facing downward. Then, a mask (not drawn) with openings formed on the corresponding position to the external electrodes 222a and 222b, and the base through-holes BH is disposed onto the mounting surface side of the base wafer 22W. The connecting electrodes 14a and 14b are formed by sputtering or vacuum-deposition. Thus, the base side surface electrodes 223a and 223b formed in step T223, and the quartz-crystal side surface electrodes 203a and 203b formed in step T203 are ensured to be electrically connected (refer to FIG. 9).

In step T25, a low-melting-point glass LG is heated, and the lid wafer 21W and quartz-crystal wafer 20W are compressed against each other. The lid wafer 21W is bonded onto the first surface Me of the quartz-crystal wafer 20W via low-melting-point glass LG.

In step T26, the bonded lid wafer 21W, the quartz-crystal wafer 20W and the base wafer 22W is cut into individual separate pieces. The second quartz-crystal vibrating device 200 is separated into individual pieces by cutting along scribe lines SL, denoted by dot-dash lines in FIGS. 12 to 14, using a dicing unit such as a laser beam or a dicing saw. Thus, several hundreds to several thousands of the second quartz-crystal vibrating devices 200 are produced.

In the manufacturing method of the second quartz-crystal vibrating device 200 explained in FIG. 11, although the low-melting-point glass LG is formed on the lid wafer 21W and the base wafer 22W, it can be formed on both surfaces of the quartz-crystal wafer 20W.

INDUSTRIAL APPLICABILITY

Representative embodiments are described in detail above; however, as will be evident to those skilled in the relevant art, the present invention may be changed or modified in various ways within its technical scope. For example, the present disclosure may be directed to piezoelectric oscillators in which an IC accommodating an oscillating circuit is mounted inside the package on the package base. In this specification, although the various embodiments have been described in the context of AT-cut quartz-crystal vibrating pieces, the present disclosure may be directed to tuning-fork type piezoelectric vibrating pieces.

If the package lid or package base is fabricated by quartz-crystal material, an AT-cut quartz-crystal material or Z-cut quartz-crystal material can be used.

Furthermore, although low-melting-point glasses are used as a sealing material, it can be replaced with polyimide resin. If the polyimide resin is used as a sealing material, a polyimide resin can be applied to the predetermined region by screen-printing, or it can be exposed after applying photosensitive polyimide resin on entire surface.

What is claimed is:

1. A piezoelectric device, comprising:
a piezoelectric frame having a piezoelectric vibrating piece that vibrates when electrically energized and an outer frame including a first principal surface and a second principal surface formed as to surround the piezoelectric vibrating piece;
a package lid having a first peripheral surface that is bonded to the first principal surface of the outer frame of the piezoelectric frame; and
a package base having a second peripheral surface that is bonded to the second principal surface of the outer frame of the piezoelectric frame;
wherein at least one of the first principal surface of the outer frame or the first peripheral surface of the package lid, and at least one of the second principal surface of the outer frame or the second peripheral surface of the package base has a rough surface;
a metal film is formed on the rough surface; and
the package lid and the outer frame, and the outer frame and the package base are bonded using a sealing material formed between metal films formed at least one of the package lid, the package base or the outer frame;
wherein, a pair of first castellations are formed on opposite peripheral edges of the outer frame of the piezoelectric frame, and a pair of second castellations are formed on opposite peripheral edges of the package base in positions that correspond to the respective first castellations while bonding the piezoelectric frame and the package base;
the piezoelectric frame comprises: a pair of excitation electrodes formed on the first principal surface and the second principal surface of the piezoelectric vibrating piece;
a first extraction electrode on the first principal surface extending from the excitation electrode on the first principal surface to the first castellation;
a second extraction electrode on the second principal surface extending from the excitation electrode on the second principal surface to the first castellation; and
a first side surface electrode that is electrically connected to the first extraction electrode and formed on the first castellation;
wherein the package base comprises a pair of second side surface electrodes that is electrically connected to the first side surface electrode or the second extraction electrode and formed on the pair of second castellations; and
wherein a pair of connecting electrodes is formed on the first castellations and the second castellations, which electrically connects the first side surface electrode or the first extraction electrode to the second side surface electrode.

2. The piezoelectric device of claim 1, wherein the sealing material includes a glass that melts at temperature between 350° C. and 410° C. or a polyimide resin.

3. The piezoelectric device of claim 1, wherein the package lid and the package base is made of a glass or a piezoelectric material.

* * * * *